United States Patent
Oruganti et al.

(10) Patent No.: US 10,162,922 B2
(45) Date of Patent: Dec. 25, 2018

(54) HYBRID CLOCK GATING METHODOLOGY FOR HIGH PERFORMANCE CORES

(71) Applicant: QUALCOMM Incorporated, San Diego, CA (US)

(72) Inventors: Kalyan Kumar Oruganti, Vijayawada (IN); Kailash Digari, Bangalore (IN); Sandeep Nellikatte Srivatsa, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 62 days.

(21) Appl. No.: 15/460,127

(22) Filed: Mar. 15, 2017

(65) Prior Publication Data

US 2018/0268088 A1 Sep. 20, 2018

(51) Int. Cl.
G06F 17/50 (2006.01)
H03K 19/00 (2006.01)

(52) U.S. Cl.
CPC ....... *G06F 17/505* (2013.01); *H03K 19/0016* (2013.01)

(58) Field of Classification Search
CPC .................................................. G06F 17/5081
USPC ........................................................ 716/104
See application file for complete search history.

(56) References Cited

U.S. PATENT DOCUMENTS

| | | | |
|---|---|---|---|
| 6,049,883 A | 4/2000 | Tjandrasuwita | |
| 7,447,923 B2 | 11/2008 | Bose et al. | |
| 7,746,116 B1 * | 6/2010 | Narayanan | H03K 19/0016 326/93 |
| 7,884,649 B1 | 2/2011 | Savoj et al. | |
| 8,656,326 B1 * | 2/2014 | Rahim | G06F 17/505 716/104 |
| 9,148,145 B2 * | 9/2015 | Gururajarao | H03K 19/0016 |
| 2004/0150427 A1 * | 8/2004 | Wilcox | G06F 17/5045 326/93 |
| 2004/0225978 A1 * | 11/2004 | Fan | G06F 17/5045 716/103 |
| 2004/0257139 A1 * | 12/2004 | Shelor | G06F 1/10 327/295 |
| 2008/0301604 A1 | 12/2008 | Itskovich et al. | |
| 2011/0296222 A1 * | 12/2011 | Tan | G06F 1/3203 713/324 |
| 2018/0107264 A1 * | 4/2018 | Liu | G06F 1/3234 |

* cited by examiner

*Primary Examiner* — Suresh Memula

(74) *Attorney, Agent, or Firm* — Loza & Loza, LLP/Qualcomm

(57) ABSTRACT

A computer-implemented method for generating a circuit design is provided according to certain aspects. The method includes determining a gating efficiency of first gate-enable logic, determining a gating efficiency of second gate-enable logic, and determining one of the first gate-enable logic and the second gate-enable logic having a greater one of the determined gating efficiencies. The method also includes placing the determined one of the first gate-enable logic and the second gate-enable logic in clock gating logic of the circuit design, and placing another one of the first gate-enable logic and the second gate-enable in data gating logic of the circuit design.

25 Claims, 9 Drawing Sheets

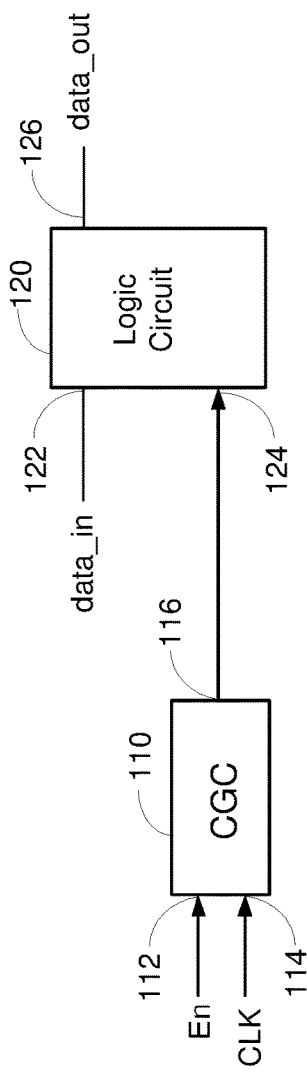
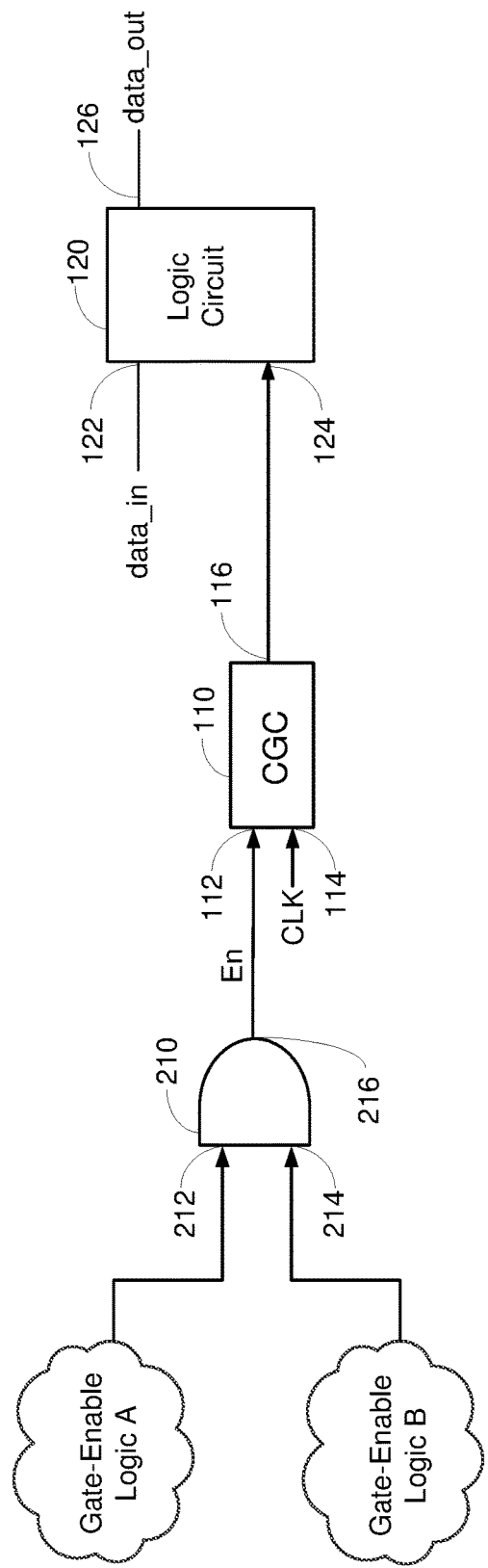

HYBRID CLOCK GATING METHODOLOGY FOR HIGH PERFORMANCE CORES

BACKGROUND

Field

Aspects of the present disclosure relate to power management, and more particularly, to hybrid clock gating.

Background

Reducing power consumption in a mobile device is important in order to extend the battery life of the mobile device. A significant contributor to power consumption of a chip (die) in a mobile device is dynamic power dissipation, which is due to switching of transistors on the chip. In this regard, various power reduction schemes have been developed to reduce dynamic power consumption on a chip. One scheme involves selectively gating a clock signal to a circuit on the chip using a clock gating cell. Gating the clock signal stops transistors in the circuit from switching, thereby reducing the dynamic power dissipation of the circuit.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

A first aspect relates to an apparatus. The apparatus includes a logic circuit having a data input, a clock input, and an output. The apparatus also includes a data gating cell having an input configured to receive a data signal, and an output coupled to the data input of the logic circuit, wherein the data gating cell is configured to selectively gate the data signal based on a first enable signal. The apparatus also includes a clock gating cell having an input configured to receive a clock signal, and an output coupled to the clock input of the logic circuit, wherein the clock gating cell is configured to selectively gate the clock signal based on a second enable signal. The apparatus further includes first gate-enable logic configured to generate the first enable signal, and second gate-enable logic configured to generate the second enable signal.

A second aspect relates to a computer-implemented method for generating a circuit design. The method includes determining a gating efficiency of first gate-enable logic, determining a gating efficiency of second gate-enable logic, and determining one of the first gate-enable logic and the second gate-enable logic having a greater one of the determined gating efficiencies. The method also includes placing the determined one of the first gate-enable logic and the second gate-enable logic in clock gating logic of the circuit design, and placing another one of the first gate-enable logic and the second gate-enable in data gating logic of the circuit design.

A third aspect relates to a computer readable storage medium storing instructions, wherein, when executed by a processor, the instructions cause the processor to perform a method for generating a circuit design. The method includes determining a gating efficiency of first gate-enable logic, determining a gating efficiency of second gate-enable logic, and determining one of the first gate-enable logic and the second gate-enable logic having a greater one of the determined gating efficiencies. The method also includes placing the determined one of the first gate-enable logic and the second gate-enable logic in clock gating logic of the circuit design, and placing another one of the first gate-enable logic and the second gate-enable in data gating logic of the circuit design.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

BRIEF DESCRIPTION OF THE DRAWINGS

FIG. 1 shows an example of a clock gating cell according to aspects of the present disclosure.

FIG. 2 shows an example of clock gating logic according to aspects of the present disclosure.

DETAILED DESCRIPTION

Figure 3:
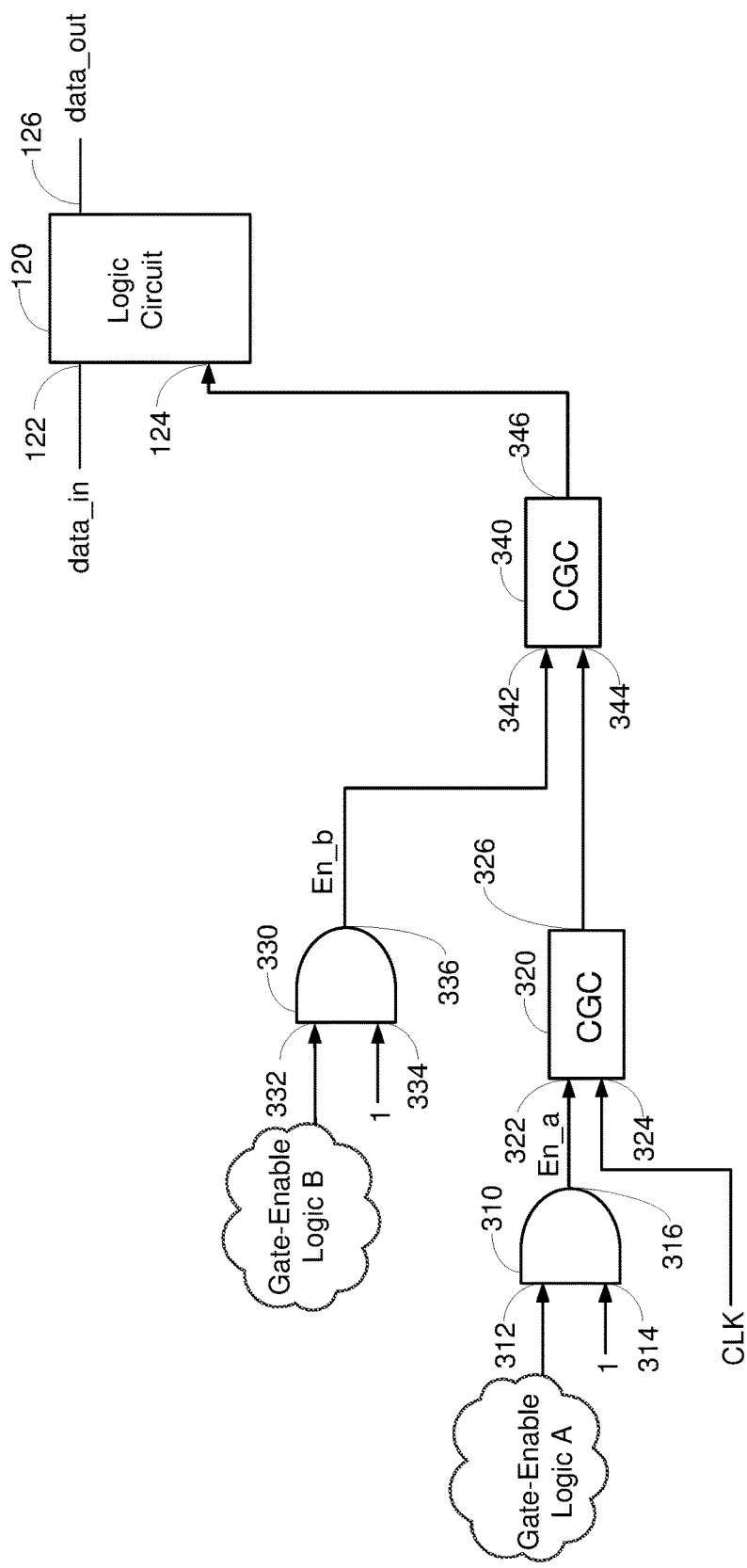
FIG. 3 shows an example in which the clock gating logic in FIG. 2 is split into multiple stages according to aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

FIG. 1 shows an example of a clock gating cell (CGC) 110 configured to selectively gate a clock signal ("CLK") to a logic circuit 120 based on an enable signal ("En"). The logic circuit 120 may be used in a processor core to process data, in which data is clocked in the logic circuit 120 using the clock signal CLK. The logic circuit 120 may include one or more flip flops, registers, multiplexers and/or logic gates. For example, the logic circuit 120 may be sequential logic including one or more flip-flops. The clock signal CLK may come from a phase locked loop (PLL) and/or another clock source via a clock path.

The CGC 110 has an enable input 112 that receives the enable signal En, a clock input 114 the receives the clock signal CLK, and an output 116 coupled to the clock input 124 of the logic circuit 120. The logic circuit 120 is configured to receive an input data signal ("data_in") at a data input 122, clock the input data signal on edges (e.g., rising edges) of the clock signal CLK, and output an output data signal ("data_out") at a data output 126. The logic circuit 120 may receive the input data signal from a logic gate, a flip flop, or another device (not shown) via a data path. If the logic circuit 120 includes one or more flip flops, then the one or more flip flops may latch data on edges (e.g., rising edges) of the clock signal CLK.

If the enable signal En is high (i.e., logic one), then the CGC 110 passes the clock signal CLK to the clock input 124 of the logic circuit 120. If the enable signal En is low (i.e., logic zero), then the CGC 110 gates (blocks) the clock signal CLK, which stops switching activity in the logic circuit 120 due to the clock signal CLK, thereby reducing dynamic power.

FIG. 2 shows an example of clock gating logic in which the enable signal En is generated by gate-enable logic. In this example, the clock gating logic includes gate-enable logic A, gate-enable logic B, and an AND gate 210. Gate-enable logic may include combinational logic (combination of logic gates such as AND, OR, NOR, NAND, NOR and/or XOR gates), flip flops, and/or multiplexers. The AND gate 210 has a first input 212 coupled to the output of gate-enable logic A, a second input 214 coupled to the output of gate-enable logic B, and an output 216 coupled to the enable input 112 of the CGC 110.

In operation, the enable signal En is high (i.e., logic one) if both outputs of gate-enable logic A and gate-enable logic B are high (i.e., logic one), in which case the CGC 110 passes the clock signal CLK to the logic circuit 120. The enable signal En is low (e.g., logic zero) if one or both outputs of gate-enable logic A and gate-enable logic B are low (i.e., logic zero), in which case the CGC 110 gates the clock signal CLK.

FIG. 3 shows an example in which the clock gating logic in FIG. 2 is split into multiple stages. In this example, the clock gating logic includes a first AND gate 310, a second AND gate 330, a first CGC 320, and a second CGC 340. The first CGC 320 and the second CGC 340 are placed on the clock path of the clock signal CLK.

In this example, the first AND gate 310 has a first input 312 coupled to the output of gate-enable logic A, a second input 314 that receives a logic one, and an output 316 coupled to the enable input 322 of the first CGC 320. The first AND gate 310 outputs an enable signal ("En_a") to the enable input 322 of the first CGC 320. The first CGC 320 has a clock input 324 that receives the clock signal CLK, and an output 326 coupled to the clock input 344 of the second CGC 340.

The second AND gate 330 has a first input 332 coupled to the output of gate-enable logic B, a second input 334 that receives a logic one, and an output 336 coupled to the enable input 342 of the second CGC 340. The second AND gate 330 outputs an enable signal ("En_b") to the enable input 342 of the second CGC 340. The second CGC 340 has a clock input 344 coupled to the output 326 of the first CGC 320, and an output 346 coupled to the clock input 124 of the logic circuit 120.

In operation, the first CGC 320 passes the clock signal CLK if enable signal En_a is high (i.e., logic one), which occurs when the output of gate-enable logic A is high (i.e., logic one), and gates the clock signal CLK if enable signal En_a is low (i.e., logic zero), which occurs when the output of gate-enable logic A is low (i.e., logic zero). The second CGC 340 passes the clock signal CLK if enable signal En_b is high (i.e., logic one), which occurs when the output of gate-enable logic B is high (i.e., logic one), and gates the clock signal CLK if enable signal En_b is low (i.e., logic zero), which occurs when the output of gate-enable logic B is low (i.e., logic zero).

In this example, the clock gating logic passes the clock signal CLK on the clock path if both CGCs 320 and 340 pass the clock signal CLK, and gates the clock signal CLK on the clock path if one or both CGCs 320 and 340 gate the clock signal CLK. Thus, the clock gating logic passes the clock signal CLK if both outputs of gate-enable logic A and gate-enable logic B are high (i.e., logic one), and gates the clock signal CLK if one or both outputs of gate-enable logic A and gate-enable logic B are low (i.e., logic zero).

The clock gating logic needs to meet certain timing requirements (e.g., setup time requirements) in order to operate properly. Meeting the timing requirements is difficult at high clock frequencies because the clock gating logic typically includes many levels of combinational logic and flops (e.g., as many as 40 levels of combinational logic and 1500 flops), which result in tighter timing margins.

If the clock gating logic is unable to meet timing requirements at a desired clock frequency, then a decision may be made to remove the corresponding CGCs from the design. However, this results in increased dynamic power consumption, which is highly undesirable for a processor core (e.g., CPU) in a mobile device with a finite battery life.

Embodiments of the present disclosure address the above problem by splitting clock gating logic between clock gating and data gating, as discussed further below.

Figure 4:
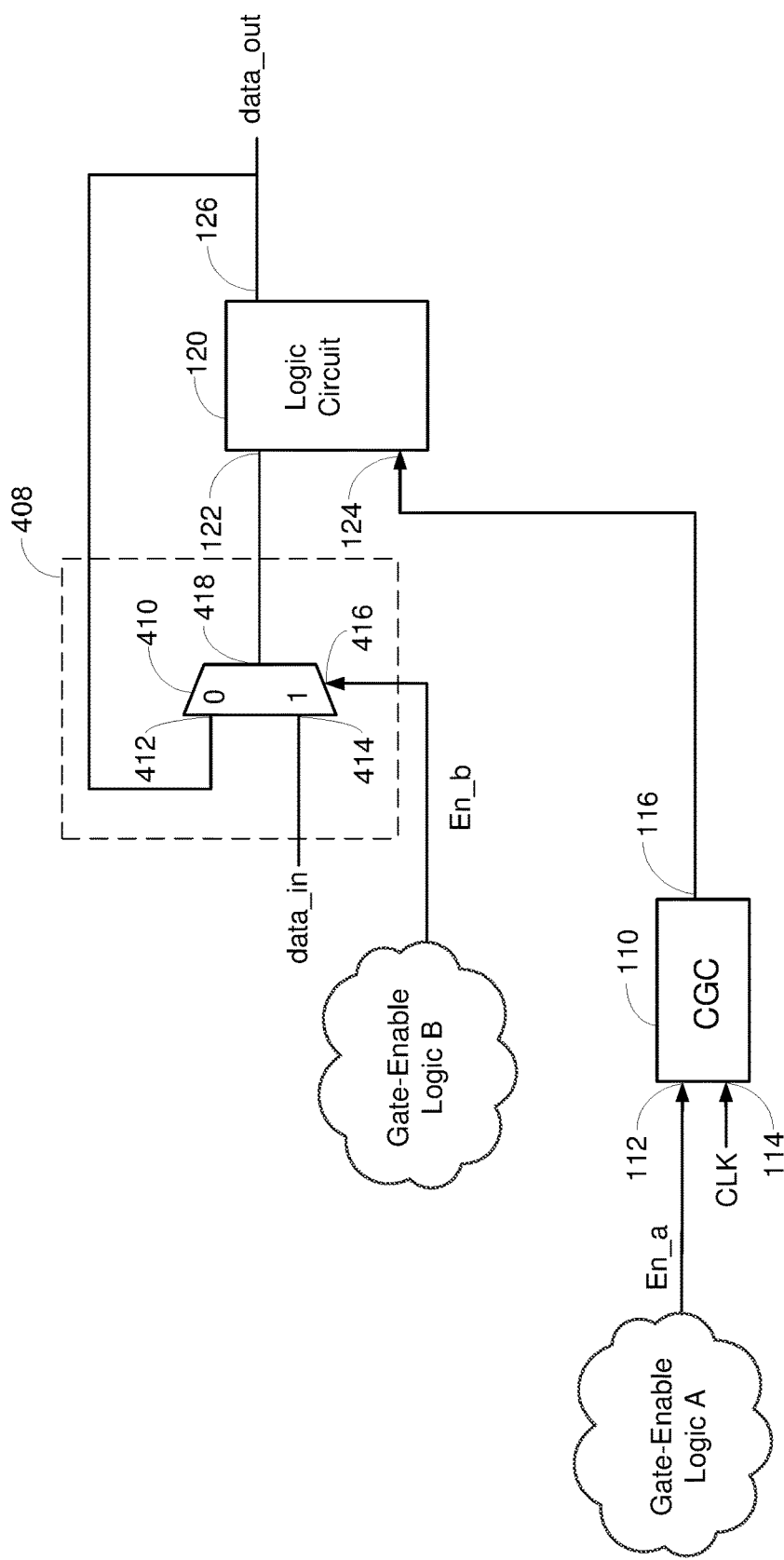
FIG. 4 shows an example of clock gating logic and data gating logic according to aspects of the present disclosure.

FIG. 4 shows an example in which the clock gating logic in FIG. 2 is split between clock gating and data gating. In this example, gate-enable logic A remains in the clock gating logic, and gate-enable logic B is moved to data gating logic. However, it is to be appreciated that gate-enable logic B may remain in the clock gating logic and gate-enable logic A may be moved to the data gating logic instead.

In this example, the clock gating logic includes the CGC 110 in the clock path. The enable input 112 of the CGC 110 is coupled to the output of gate-enable logic A, the clock input of the CGC 110 receives the clock signal CLK, and the output of the CGC 110 is coupled to the clock input 124 of the logic circuit 120. If the enable signal ("En_a") from gate-enable logic A is high (i.e., logic one), then the CGC 110 passes the clock signal CLK to the clock input 124 of the logic circuit 120. If the enable signal En_a from gate-enable logic A is low (i.e., logic zero), then the CGC 110 gates (blocks) the clock signal CLK, which stops switching activity in the logic circuit 120 due to the clock signal CLK.

In this example, the data gating logic includes a data gating cell 408. In the example shown in FIG. 4, the data gating cell 408 includes a multiplexer 410 in the data path. The multiplexer 410 has a first input 412 coupled to the output 126 of the logic circuit 120, a second input 414 coupled to the input data signal, a select input 416 coupled to the output of gate-enable logic B, and an output 418 coupled to the data input 122 of the logic circuit 120. If the enable signal ("En_b") from gate-enable logic B is high (i.e., logic one), then the multiplexer 410 selects the second input 414, in which case the input data signal is passed to the data input 122 of the logic circuit 120. If the enable signal En_b from gate-enable logic B is low (i.e., logic zero), then the multiplexer 410 selects the first input 412, in which case the input 122 and output 126 of the logic circuit 120 are coupled together. This reduces switching activity in the logic circuit 120 by holding the data static at the input 122 of the logic circuit 120. Thus, the input data signal is gated when the enable signal En_b is low (i.e., logic zero). While reducing dynamic power, data gating typically does not reduce dynamic power as much as clock gating.

It is to be appreciated that the data gating cell 408 is not limited to the exemplary implementation shown in FIG. 4, and may be implemented using other logic that selectively gates the input data signal to the logic circuit 120 based on the logic value of the enable signal En_b. In general, the data gating cell 408 gates the input data signal by holding the data input 122 of the logic circuit 120 static, and un-gates the input data signal by passing the input data signal to the data input 122 of the logic circuit 120.

Moving a portion of the clock gating logic (e.g., gate-enable logic B) to the data gating logic reduces the number of logic levels in the clock logic. This makes it easier for the remaining clock gating logic to meet timing requirements (e.g., setup time requirements). Because it is now easier for the clock gating logic to meet timing requirements, the frequency of the clock signal CLK may be increased to increase performance (e.g., increase the data rate).

Moving a portion of the clock gating logic (e.g., gate-enable logic B) to the data gating logic increases the number of logic levels in the data path because of the addition of the multiplexer 410 in the data path. However, the data path may have more a relaxed timing margin compared with the clock gating path, and therefore still be able to make timing even with the additional logic level.

Thus, splitting the clock gating logic between clock gating and data gating makes it easier to meet timing requirements for higher clock frequencies. This allows the system to operate at higher clock frequencies, which increases performance.

Splitting the clock gating logic results in a small degradation in dynamic power savings (e.g., 2% degradation). This is because data gating is typically not as effective at reducing dynamic power as clock gating. However, the small degradation in power savings is offset by the increase in performance. In addition, this approach provides a better solution for making timing compared with removing the CGCs entirely, which results in a much larger increase in dynamic power.

A method for splitting clock gating logic between clock gating and data gating is described below according to certain aspects of the present disclosure. In certain aspects, the method intelligently splits the clock gating logic to reduce degradation in dynamic power savings, as discussed further below.

Figure 5:
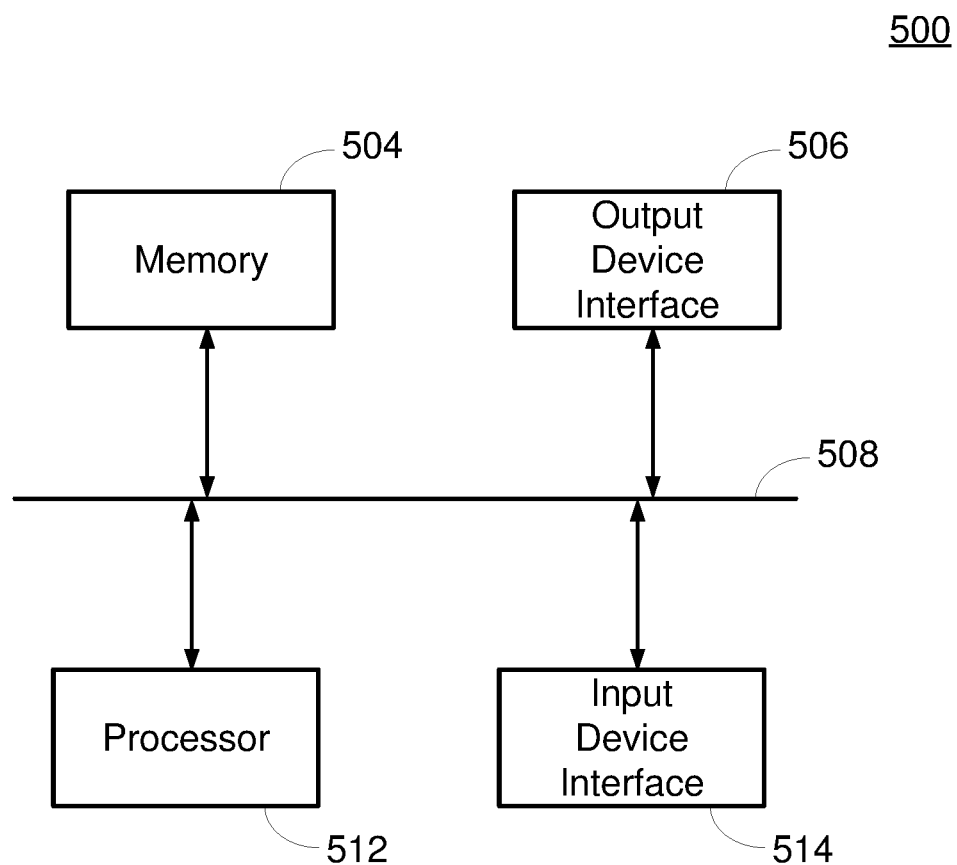
FIG. 5 shows an example of a computing system with which features of the present disclosure may be implemented.

The method may be a performed by a computing system (e.g., running an electronic design automation (EDA) tool). In this regard, FIG. 5 shows an example of a computing system 500 for performing the method. The computing system 500 includes a bus 508, a processor 512, a memory 504, an input device interface 514, and an output device interface 506. The bus 508 collectively represents all system buses that communicatively couple the numerous devices of the computing system 500. For instance, the bus 508 communicatively couples the processor 512 with the memory 504.

In operation, the processor 512 may retrieve instructions from the memory 504 for performing one or more of the functions described herein, and execute the instructions to perform the one or more functions. For example, processor 512 may retrieve instructions for performing the method discussed below, and execute the instructions to perform the method. The processor 512 may be a single processor or a multi-core processor. The memory 504 may include a random access memory (RAM), a read only memory (ROM), a flash memory, registers, a hard disk, a removable disk, a CD-ROM, or any combination thereof.

The bus 508 may also couple to the input and output device interfaces 514 and 506. The input device interface 514 may enable a user to communicate information and enter commands to the computing system 500, and may include, for example, an alphanumeric keyboard and a pointing device (e.g., a mouse). For example, the user may use the input device interface 514 to enter a command to the processor 512 to perform the method, edit a circuit design, etc. The output device interface 506 may enable, for example, the display of information generated by the computing system 500 to a user, and may include, for example, a display device (e.g., liquid crystal display (LCD)).

The method may start with clock gating logic (e.g., clock gating logic in FIG. 2 or 3) that is to be split between clock gating and data gating. The design of a circuit (e.g., an integrated circuit) including the clock gating logic may be specified in a file stored on the memory 504. The method is described below using the example of gate-enable logic A and gate-enable logic B, in which the processor 512 performs the method. However, it is to be understood that the present disclosure is not limited to this example, as discussed further below.

The processor 512 determines a gating efficiency of gate-enable logic A and a gating efficiency of gate-enable logic B. For example, the processor 512 may determine the gating efficiency of gate-enable logic A by running a computer simulation of the circuit including the clock gating logic and the logic circuit 120 over many clock cycles (e.g., hundreds or thousands of cycles of the clock signal CLK), and observing the number of clock cycles during which gate-enable logic A causes the clock signal CLK to be gated. In this example, gate-enable logic A may be determined to cause the clock signal CLK to be gated during a clock cycle when gate-enable logic A outputs a logic zero during the clock cycle (which causes the enable signal En to be zero in the example in FIG. 2). The processor 512 may then determine the gating efficiency of gate-enable logic A based on the number of clock cycles that gate-enable logic A causes the clock signal CLK to be gated. The gating efficiency may be represented as a ratio of the number of clock cycles that gate-enable logic A causes the clock signal CLK to be gated over the total number of observed clock cycles, or another quantity based on the number of clock cycles that gate-enable logic A causes the clock signal CLK to be gated.

Similarly, the processor 512 may determine the gating efficiency of gate-enable logic B by running a computer simulation of the circuit including the clock gating logic and the logic circuit 120 over many clock cycles (e.g., hundreds or thousands of cycles of the clock signal CLK), and observing the number of clock cycles during which gate-enable logic B causes the clock signal CLK to be gated. In this example, gate-enable logic B may be determined to cause the clock signal CLK to be gated during a clock cycle when gate-enable logic B outputs a logic zero during the clock cycle (which causes the enable signal En to be zero in the example in FIG. 2). The processor 512 may then determine the gating efficiency of gate-enable logic B based on the number of clock cycles that gate-enable logic B causes the clock signal CLK to be gated. The gating efficiency may be represented as a ratio of the number of clock cycles that gate-enable logic B causes the clock signal CLK to be gated over the total number of observed clock cycles, or another quantity based on the number of clock cycles that gate-enable logic B causes the clock signal CLK to be gated.

After determining the gating efficiencies of gate-enable logic A and gate-enable logic B, the processor 512 may determine which gate-enable logic has the greater gating efficiency. For example, if gate-enable logic A has a gating efficiency of $100/1000$ (i.e., causes clock gating for 100 out of 1000 clock cycles) and gate-enable logic B has a gating efficiency of $20/1000$ (i.e., causes clock gating for 20 out of 1000 clock cycles), then the processor 512 may determine that the gating efficiency of gate-enable logic A is greater.

After determining which gate-enable logic has the greater gating efficiency (i.e., which gate-enable logic is more efficient at gating the clock signal CLK), the processor 512 keeps the more efficient gate-enable logic in the clock gating logic, and moves the less efficient gate-enable logic to the data gating logic. Moving the less efficient gate-enable logic to the data gating logic reduces the degradation in dynamic power savings caused by splitting the clock gating logic between clock gating and data gating. This is because moving the less efficient gate-enable logic to the data gating logic has a smaller impact on clock gating (and therefore results in a smaller degradation in dynamic power savings) compared with moving the more efficient gate-enable logic to the data gating logic. For the example in which gate-enable logic A is more efficient than gate-enable logic B at clock gating, the processor 512 keeps gate-enable logic A in the clock gating path while moving gate-enable logic B to the data gating path.

Using the example shown in FIG. 2, the processor 512 may split the clock gating logic as follows. The processor 512 may remove the AND gate 210 and couple the output of gate-enable logic A to the enable input 112 of the CGC 110, as shown in FIG. 4. The processor 512 may also add the multiplexer 410 to the input data path of the logic circuit 120 with the first input 412 of the multiplexer 410 coupled to the output 126 of the logic circuit 120, the second input 414 of the multiplexer 410 coupled to the input data signal, and the output 418 of the multiplexer 410 coupled to the data input 122 of the logic circuit 120. The processor 512 may also couple the output of gate-enable logic B to the select input 416 of the multiplexer 410, as shown in FIG. 4. Thus, in this example, gate-enable logic A is kept in the clock gating logic where gate-enable logic A controls gating of the clock signal CLK to the logic circuit 120. Gate-enable logic B is moved to the data gating logic to control gating of the input data signal to the logic circuit 120. The processor 512 may then store the resulting clock gating logic and data gating logic in a file, and store the file in the memory 504 and/or another memory for later use.

It is to be appreciated that embodiments of the present disclosure are not limited to splitting the exemplary clock gating logic shown in FIGS. 2 and 3. Embodiments of the present disclosure may be used to split other clock gating logic designs incorporating gate-enable logic A and gate-enable logic B, and is therefore not limited to a particular clock gating logic design.

Although embodiments of the present disclosure are described above using the example of gate-enable logic A and gate-enable logic B, it is to be understood that the present disclosure is not limited to this example.

In general, the processor 512 may receive a circuit design including clock gating logic to be split. The circuit design may be specified in a file stored on the memory 504. The processor 512 may then determine the gating efficiencies of different gate-enable logic in the clock gating logic, and determine which gate-enable logic has the greater gating efficiency (i.e., is more efficient at gating the clock signal CLK).

After determining which gate-enable logic is more efficient at gating the clock signal CLK, the processor 512 keeps the more efficient gate-enable logic in the clock gating logic, and moves the less efficient gate-enable logic to the data gating logic. Moving the less efficient gate-enable logic to the data gating logic reduces the degradation in dynamic power savings caused by splitting the clock gating logic between clock gating and data gating, as discussed above. The processor 512 may then store the resulting clock gating logic and data gating logic in a file, and store the file in the memory 504 and/or another memory for later use.

In the example shown in FIG. 2, the outputs of gate-enable logic A and gate-enable logic B are input to AND gate 210 to generate the enable signal En to CGC 110. However, it is to be appreciated that the present disclosure is not limited to this example. With a proper selection of a CGC (active-high or active-low enabled CGC) and/or a multiplexer, different types of logic gates may be used including a NOR gate, a NAND gate or a OR gate for different combinations of the outputs of gate-enable logic A and B including A AND B, A OR B, (NOT A) AND B, (NOT A) OR B, etc.

Figure 6:
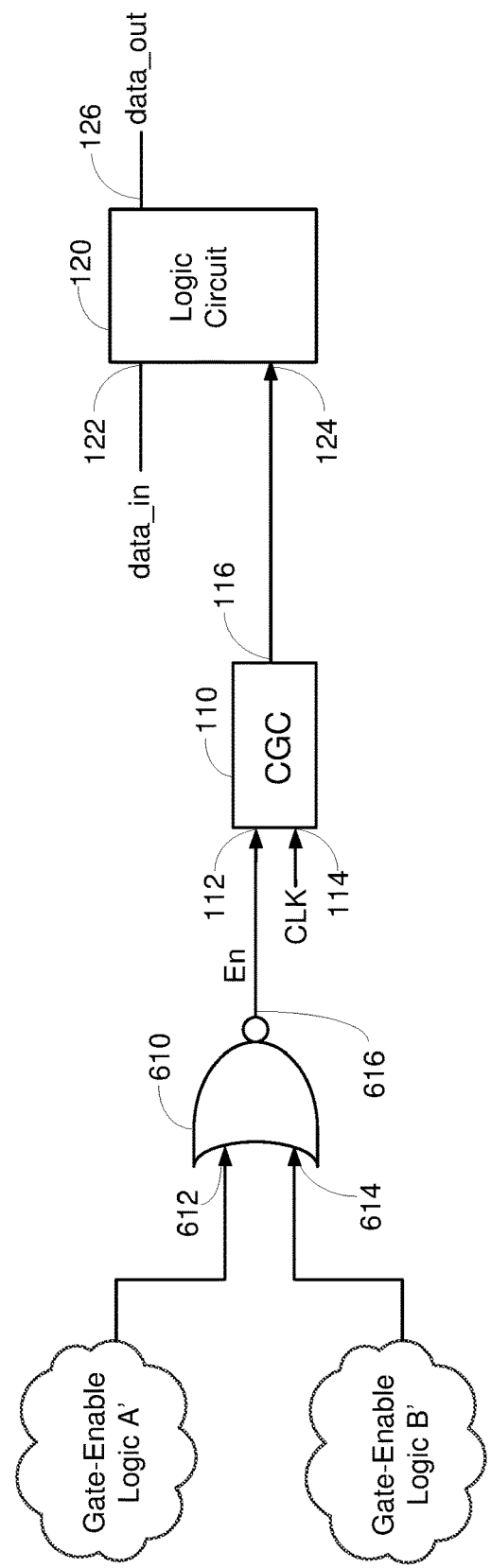
FIG. 6 shows another example of clock gating logic according to aspects of the present disclosure.

For example, FIG. 6 shows exemplary clock gating logic including gate-enable logic A', gate-enable logic B', and a NOR gate 610 instead of AND gate 210. Gate-enable logic A' outputs the inverse of gate-enable logic A, and may be implemented by inverting the output of gate-enable logic A. Gate-enable logic B' outputs the inverse of gate-enable logic B, and may be implemented by inverting the output of gate-enable logic B.

In the example shown in FIG. 6, the NOR gate has a first input 612 coupled to the output of gate-enable logic A', a second input 614 coupled to the output of gate-enable logic B', and an output 616 coupled to the enable input 112 of the CGC 110. In operation, the enable signal En is high (i.e., logic one) if both outputs of gate-enable logic A' and gate-enable logic B' are low (i.e., logic zero), in which case the CGC 110 passes the clock signal CLK to the logic circuit 120. The enable signal En is low (e.g., logic zero) if one or both outputs of gate-enable logic A' and gate-enable logic B' are high (i.e., logic one), in which case the CGC 110 gates the clock signal CLK.

Thus, the clock gating logic in FIG. 6 gates the clock signal CLK when one or both outputs of gate-enable logic A' and gate-enable logic B' are one. Since gate-enable logic A' and gate-enable logic B' output the inverse of gate-enable logic A and gate-enable logic B, respectively, the clock gating logic in FIG. 6 implements the same gating function as the clock gating logic in FIG. 2.

Figure 7:
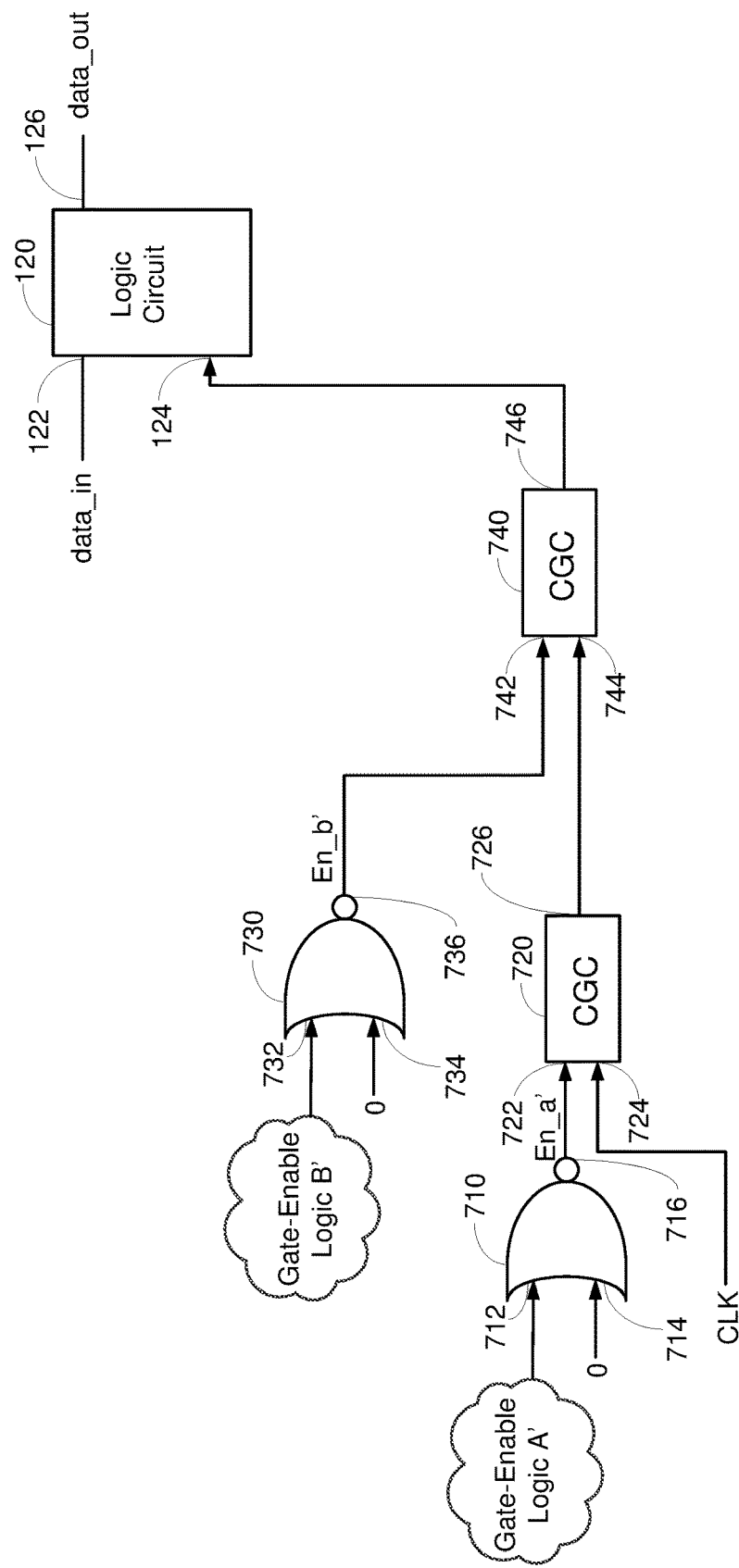
FIG. 7 shows an example in which the clock gating logic in FIG. 6 is split into multiple stages according to aspects of the present disclosure.

FIG. 7 shows an example in which the clock gating logic in FIG. 6 is split into multiple stages. In this example, the clock gating logic includes a first NOR gate 710, a second NOR gate 730, a first CGC 720, and a second CGC 740. The first CGC 720 and the second CGC 740 are placed on the clock path of the clock signal CLK.

In this example, the first NOR gate 710 has a first input 712 coupled to the output of gate-enable logic A', a second input 714 that receives a logic zero, and an output 716 coupled to the enable input 722 of the first CGC 720. The first NOR gate 710 outputs an enable signal ("En_a'") to the enable input 722 of the first CGC 720. The first CGC 720 has a clock input 724 that receives the clock signal CLK, and an output 726 coupled to the clock input 744 of the second CGC 740.

The second NOR gate 730 has a first input 732 coupled to the output of gate-enable logic B', a second input 734 that receives a logic zero, and an output 736 coupled to the enable input 742 of the second CGC 740. The second NOR gate 730 outputs an enable signal ("En_b'") to the enable input 742 of the second CGC 740. The second CGC 740 has a clock input 744 coupled to the output 726 of the first CGC 720, and an output 746 coupled to the clock input 124 of the logic circuit 120.

In operation, the first CGC 320 passes the clock signal CLK if enable signal En_a' is high (i.e., logic one), which occurs when the output of gate-enable logic A' is low (i.e., logic zero), and gates the clock signal CLK if enable signal En_a' is low (i.e., logic zero), which occurs when the output of gate-enable logic A' is high (i.e., logic one). The second CGC 740 passes the clock signal CLK if enable signal En_a' is high (i.e., logic one), which occurs when the output of gate-enable logic B' is low (i.e., logic zero), and gates the clock signal CLK if enable signal En_b' is low (i.e., logic zero), which occurs when the output of gate-enable logic B' is high (i.e., logic one).

In this example, the clock gating logic passes the clock signal CLK on the clock path if both CGCs 720 and 740 pass the clock signal CLK, and gates the clock signal CLK on the clock path if one or both CGCs 720 and 740 gate the clock signal CLK. Thus, the clock gating logic passes the clock signal CLK if both outputs of gate-enable logic A' and gate-enable logic B' are low (i.e., logic zero), and gates the clock signal CLK if one or both outputs of gate-enable logic A' and gate-enable logic B' are high (i.e., logic one).

Figure 8:
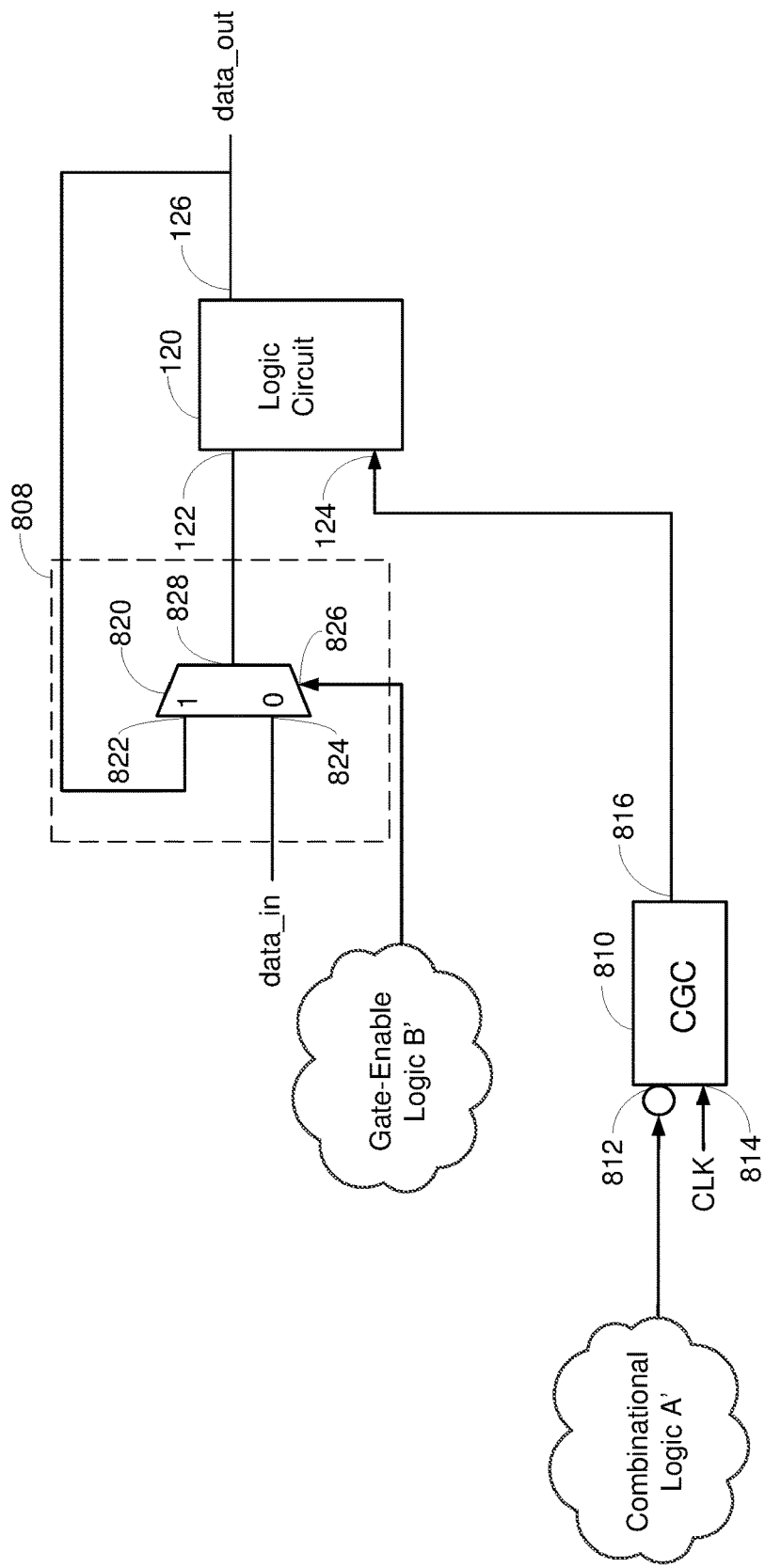
FIG. 8 shows another example of clock gating logic and data gating logic according to aspects of the present disclosure.

FIG. 8 shows an example in which the clock gating logic in FIG. 6 is split between clock gating and data gating. In this example, gate-enable logic A' remains in the clock gating logic, and gate-enable logic B' is moved to data gating logic. However, it is to be appreciated that gate-enable logic B' may remain in the clock gating logic and gate-enable logic A' may be moved to the data gating logic instead.

In this example, the clock gating logic includes CGC 810 in the clock path. The enable input 812 of the CGC 810 is coupled to the output of gate-enable logic A', the clock input of the CGC 810 receives the clock signal CLK, and the output of the CGC 810 is coupled to the clock input 124 of the logic circuit 120. The enable input 812 of CGC 810 is inverting, which is represented by the circle at the enable input 812. If the output of gate-enable logic A' is low (i.e., logic zero), then the CGC 810 passes the clock signal CLK to the clock input 124 of the logic circuit 120. If the output gate-enable logic A' is high (i.e., logic one), then the CGC 810 gates (blocks) the clock signal CLK.

In this example, the data gating logic includes a data gating cell 808. In the example shown in FIG. 8, the data gating cell 808 includes a multiplexer 820 in the data path. The multiplexer 820 has a first input 822 coupled to the output 126 of the logic circuit 120, a second input 824 coupled to the input data signal, a select input 826 coupled to the output of gate-enable logic B', and an output 828 coupled to the data input 122 of the logic circuit 120. If the output of gate-enable logic B' is low (i.e., logic zero), then the multiplexer 820 selects the second input 824, in which case the input data signal is passed to the data input 122 of the logic circuit 120. If the output of gate-enable logic B' is high (i.e., logic one), then the multiplexer 820 selects the first input 822, in which case the input 122 and output 126 of the logic circuit 120 are coupled together, and the input data signal is gated.

The processor 512 may intelligently split the clock gating logic in FIG. 6 between the clock gating logic and data gating logic shown in FIG. 8 using the method discussed above according to aspects of the present disclosure. More particularly, the processor 512 may determine the gating efficiencies of gate-enable logic A' and gate-enable logic B', and determine which gate-enable logic has the greater gating efficiency (i.e., is more efficient at gating the clock signal CLK). After determining which gate-enable logic is more efficient at gating the clock signal CLK, the processor 512 keeps the more efficient gate-enable logic in the clock gating logic, and moves the less efficient gate-enable logic to the data gating logic.

As discussed above, embodiments of the present disclosure place the gate-enable logic with the higher gating efficiency in the clock gating path, and place the gate-enable logic with the lower gating efficiency in the data gating path. In the example shown in FIG. 4, gate-enable logic A has a higher gating efficiency than gate-enable logic B, and, in the example shown in FIG. 8, gate-enable logic A' has a higher gating efficiency than gate-enable logic B'. In certain aspects, the gate-enable logic for the clock gating cell may have a gating efficiency that is at least 50% greater, at least 100% greater, or at least 200% greater than a gating efficiency of the gate-enable logic for the data gating cell. In these aspects, the gating efficiency of the gate-enable logic for the data gating cell may be defined as a ratio of the number of clock cycles the gate-enable logic gates the data signal over a predetermined number of cycles of the clock signal CLK (e.g., 1000 or more cycles), and the gating efficiency of the gate-enable logic for the clock gating cell may be defined as a ratio of the number of clock cycles the gate-enable logic gates the clock signal CLK over the predetermined number of cycles of the clock signal CLK.

Each gate-enable logic discussed above may have multiple respective inputs that receive respective input control signals from a power management system (not shown in FIG. 4 or 8) and/or another system. The gate-enable logic may perform a logic function on the respective input control signals (e.g., using combinational logic) to generate the respective enable signal. The power management system and/or other system may control the logic values of the input control signals such that the input control signals cause the gate-enable logic to gate the data signal or clock signal when certain conditions are met. For example, the power system and/or other system may detect when a processor including the logic circuit 120 enters an idle state, and gate the data signal or the clock signal when the processor enters the idle state. The processor may enter the idle state, for example, after the processor completes a task, when no user activity is detected for a predetermined period of time, when a mobile device incorporating the processor locks out or enters a sleep mode, etc. It is to be appreciated that the present disclosure is not limited to the exemplary conditions discussed above.

Figure 9:
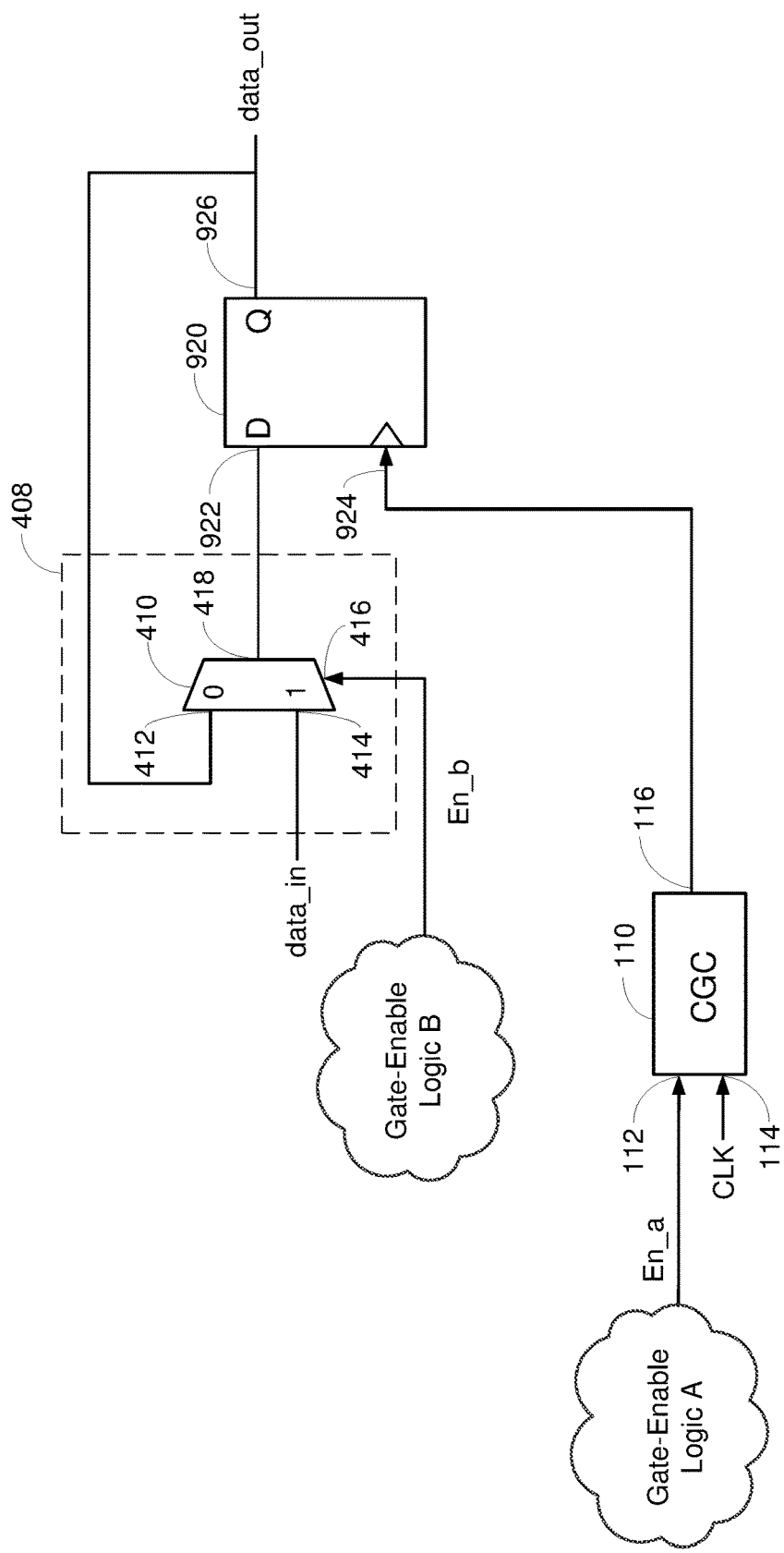
FIG. 9 shows an example in which a logic circuit includes a flip flop according to aspects of the present disclosure.

FIG. 9 shows an example in which the logic circuit 120 includes a flip flop 920. In this example, the flip flop 120 has a data input 922 (labeled "D") coupled to the output 418 of the multiplexer 410, a data output 926 (labeled "Q"), and a clock input 924. In operation, the flip flop 920 is configured to latch a logic value at the data input 922 on a rising or falling edge of the clock signal at the clock input 924.

In this example, the CGC 110 selectively gates the clock signal CLK to the clock input 924 of the flip flop 920 based on the enable signal En_a from gate-enable logic A. For example, the CGC 110 may gate the clock signal CLK when the enable signal En_a is low, and pass the clock signal CLK to the clock input 924 of the flip flop 920 when the enable signal En_a is high.

In this example, the data gating cell 408 selectively gates the input data signal to the data input 922 of the flip flop 920. In the example shown in FIG. 9, the data gating cell 408 includes the multiplexer 410, in which the first input 412 of the multiplexer 410 is coupled to the data output 926 of the flip flop 920, the second input 414 of the multiplexer 410 is coupled to the input data signal, the select input 416 of the multiplexer 410 is coupled to the output of gate-enable logic B, and the output 418 of the multiplexer 410 is coupled to the data input 922 of the flip flop 920. If the enable signal ("En_b") from gate-enable logic B is high (i.e., logic one), then the multiplexer 410 selects the second input 414, in which case the input data signal is passed to the data input 922 of the flip flop 920. If the enable signal En_b from gate-enable logic B is low (i.e., logic zero), then the multiplexer 410 selects the first input 412, in which case the input 922 and output 926 of the flip flop 920 are coupled together, thereby data gating the flip flop 920.

Although one flip flop 920 is shown in FIG. 9 for ease of illustration, it is to be appreciated that the logic circuit 120 may include more than one flip flop.

Figure 10:
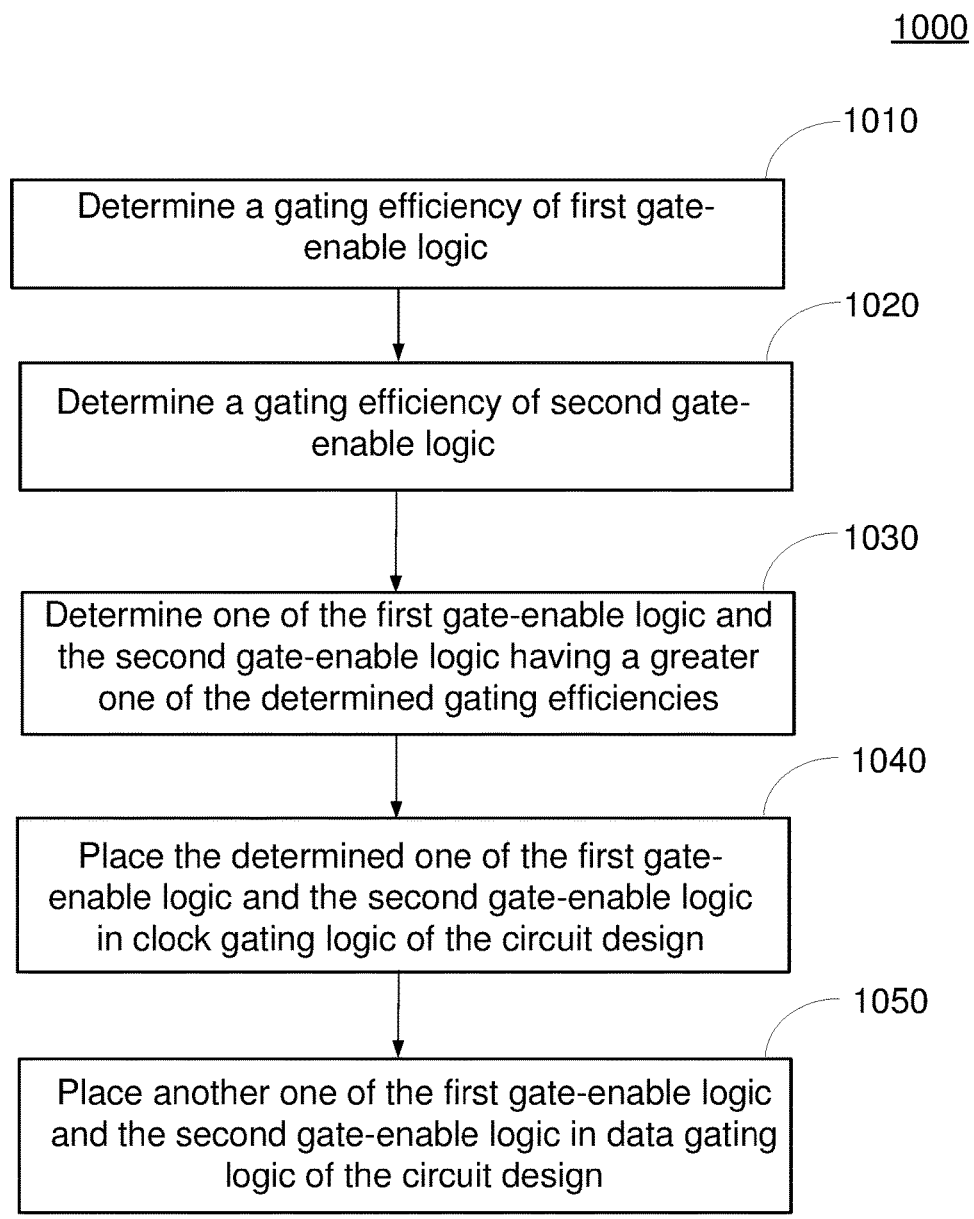
FIG. 10 is a flowchart illustrating an exemplary method for generating a circuit design according to certain aspects of the present disclosure.

FIG. 10 is a flowchart illustrating a method 1000 for generating a circuit design according to certain aspects of the present disclosure. The method 1000 may be performed by the processor 512.

At step 1010, a gating efficiency of first gate-enable logic is determined. For example, the gating efficiency of the first gate-enable logic (e.g., gate-enable logic A) may be determined by selectively gating a clock signal (e.g., clock signal CLK) based on an output of the first gate-enable logic, and determining a number clock cycles during which the output of the first gate-enable logic causes the clock signal to be gated.

At step 1020, a gating efficiency of second gate-enable logic is determined. For example, the gating efficiency of the second gate-enable logic (e.g., gate-enable logic B) may be determined by selectively gating a clock signal (e.g., clock signal CLK) based on an output of the second gate-enable logic, and determining a number clock cycles during which the output of the second gate-enable logic causes the clock signal to be gated.

At step 1030, one of the first gate-enable logic and the second gate-enable logic having a greater one of the determined gating efficiencies is determined.

At step 1040, the determined one of the first gate-enable logic and the second gate-enable logic is placed in clock gating logic of the circuit design. For example, the determined one of the first gate-enable logic and the second gate-enable logic may be placed in the clock gating logic by coupling an output of the determined one of the first gate-enable logic and the second gate-enable logic to an enable input of a CGC (e.g., CGC 110 or 810) in the clock gating logic.

At step 1050, another one of the first gate-enable logic and the second gate-enable is placed in data gating logic of the circuit design. For example, the other one of the first gate-enable logic and the second gate-enable logic may be placed in the data gating logic by coupling an output of the other one of the first gate-enable logic and the second gate-enable logic to a select input of a multiplexer (e.g., multiplexer 410 or 820) in the data gating logic.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two components.

It is to be understood that the present disclosure is not limited to the specific order or hierarchy of steps in the methods disclosed herein. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The steps of a method described in connection with the disclosure herein may be embodied directly in hardware, in a software module executed by a processor (e.g., processor 512), or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium (e.g., memory 504) may be coupled to the processor such that the processor can read information from, and write information to, the storage medium. In the alternative, the storage medium may be integral to the processor. The processor and the storage medium may reside in a computing system (e.g., computing system 500).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a logic circuit having a data input, a clock input, and an output;
   a data gating cell having an input configured to receive a data signal, and an output coupled to the data input of the logic circuit, wherein the data gating cell is configured to selectively gate the data signal based on a first enable signal;
   first gate-enable logic configured to generate the first enable signal;
   a clock gating cell having an input configured to receive a clock signal, and an output coupled to the clock input of the logic circuit, wherein the clock gating cell is configured to selectively gate the clock signal based on a second enable signal; and
   second gate-enable logic configured to generate the second enable signal.

2. The apparatus of claim 1, wherein the second gate-enable logic has a gating efficiency that is at least 50% greater than a gating efficiency of the first gate-enable logic.

3. The apparatus of claim 1, wherein the second gate-enable logic has a gating efficiency that is at least 100% greater than a gating efficiency of the first gate-enable logic.

4. The apparatus of claim 1, wherein the data gating cell comprises a multiplexer having a first input coupled to the output of the logic circuit, a second input configured to receive the data signal, a select input configured to receive the first enable signal, and an output coupled to the data input of the logic circuit, wherein the multiplexer is configured to select one of the first and second inputs based on the first enable signal, and to couple the selected one of the first and second inputs to the data input of the logic circuit.

5. The apparatus of claim 1, wherein the logic circuit comprises a flip flop.

6. A computer-implemented method for generating a circuit design, comprising:
determining a gating efficiency of first gate-enable logic;
determining a gating efficiency of second gate-enable logic;
determining one of the first gate-enable logic and the second gate-enable logic having a greater one of the determined gating efficiencies;
placing the determined one of the first gate-enable logic and the second gate-enable logic in clock gating logic of the circuit design; and
placing another one of the first gate-enable logic and the second gate-enable in data gating logic of the circuit design.

7. The method of claim 6, wherein an output of the determined one of the first gate-enable logic and the second gate-enable logic controls gating of a clock signal by the clock gating logic.

8. The method of claim 7, wherein an output of the other one of the first gate-enable logic and the second gate-enable controls gating of a data signal by the data gating logic.

9. The method of claim 6, wherein the clock gating logic selectively gates a clock signal to a clock input of a logic circuit, and the data gating logic selectively gates a data signal to a data input of the logic circuit.

10. The method of claim 9, wherein the clock gating logic includes a clock gating cell (CGC) having an enable input, a clock input that receives the clock signal, and an output coupled to the clock input of the logic circuit, and wherein placing the determined one of the first gate-enable logic and the second gate-enable logic in the clock gating logic of the circuit design comprises coupling an output of the determined one of the first gate-enable logic and the second gate-enable logic to the enable input of the CGC.

11. The method of claim 9, wherein the data gating logic includes a multiplexer having a first input that receives the data signal, a second input coupled to an output of the logic circuit, a select input, and an output coupled to the data input of the logic circuit, and wherein placing the other one of the first gate-enable logic and the second gate-enable logic in the data gating logic of the circuit design comprises coupling an output of the other one of the first gate-enable logic and the second gate-enable logic to the select input of the multiplexer.

12. The method of claim 9, wherein the logic circuit includes one or more flip flops clocked by the clock signal.

13. The method of claim 6, wherein determining the gating efficiency of the first gate-enable logic comprises:
selectively gating a clock signal based on an output of the first gate-enable logic;
determining a number clock cycles during which the output of the first gate-enable logic causes the clock signal to be gated; and
determining the gating efficiency of the first gate-enable logic based on the determined number of clock cycles during which the output of the first gate-enable logic causes the clock signal to be gated.

14. The method of claim 13, wherein selectively gating the clock signal based on the output of the first gate-enable logic is performed by a clock gating cell having an enable input coupled to the output of the first gate-enable logic.

15. The method of claim 13, wherein determining the gating efficiency of the second gate-enable logic comprises:
selectively gating the clock signal based on an output of the second gate-enable logic;
determining a number clock cycles during which the output of the second gate-enable logic causes the clock signal to be gated; and
determining the gating efficiency of the second gate-enable logic based on the determined number of clock cycles during which the output of the second gate-enable logic causes the clock signal to be gated.

16. A non-transitory computer readable storage medium storing instructions, wherein, when executed by a processor, the instructions cause the processor to perform a method for generating a circuit design, the method comprising:
determining a gating efficiency of first gate-enable logic;
determining a gating efficiency of second gate-enable logic;
determining one of the first gate-enable logic and the second gate-enable logic having a greater one of the determined gating efficiencies;
placing the determined one of the first gate-enable logic and the second gate-enable logic in clock gating logic of the circuit design; and
placing another one of the first gate-enable logic and the second gate-enable in data gating logic of the circuit design.

17. The non-transitory computer readable storage medium of claim 16, wherein an output of the determined one of the first gate-enable logic and the second gate-enable logic controls gating of a clock signal by the clock gating logic.

18. The non-transitory computer readable storage medium of claim 17, wherein an output of the other one of the first gate-enable logic and the second gate-enable controls gating of a data signal by the data gating logic.

19. The non-transitory computer readable storage medium of claim 16, wherein the clock gating logic selectively gates a clock signal to a clock input of logic circuit, and the data gating logic selectively gates a data signal to a data input of the logic circuit.

20. The non-transitory computer readable storage medium of claim 19, wherein the clock gating logic includes a clock gating cell (CGC) having an enable input, a clock input that receives the clock signal, and an output coupled to the clock input of the logic circuit, and wherein placing the determined one of the first gate-enable logic and the second gate-enable logic in the clock gating logic of the circuit design comprises coupling an output of the determined one of the first gate-enable logic and the second gate-enable logic to the enable input of the CGC.

21. The non-transitory computer readable storage medium of claim 19, wherein the data gating logic includes a multiplexer having a first input that receives the data signal, a second input coupled to an output of the logic circuit, a select input, and an output coupled to the data input of the logic circuit, and wherein placing the other one of the first gate-enable logic and the second gate-enable logic in the data gating logic of the circuit design comprises coupling an output of the other one of the first gate-enable logic and the second gate-enable logic to the select input of the multiplexer.

22. The non-transitory computer readable storage medium of claim 19, wherein the logic circuit includes one or more flip flops clocked by the clock signal.

23. The non-transitory computer readable storage medium of claim 16, wherein determining the gating efficiency of the first gate-enable logic comprises:
   selectively gating a clock signal based on an output of the first gate-enable logic;
   determining a number clock cycles during which the output of the first gate-enable logic causes the clock signal to be gated; and
   determining the gating efficiency of the first gate-enable logic based on the determined number of clock cycles during which the output of the first gate-enable logic causes the clock signal to be gated.

24. The non-transitory computer readable storage medium of claim 23, wherein selectively gating the clock signal based on the output of the first gate-enable logic is performed by a clock gating cell having an enable input coupled to the output of the first gate-enable logic.

25. The non-transitory computer readable storage medium of claim 23, wherein determining the gating efficiency of the second gate-enable logic comprises:
   selectively gating the clock signal based on an output of the second gate-enable logic;
   determining a number clock cycles during which the output of the second gate-enable logic causes the clock signal to be gated; and
   determining the gating efficiency of the second gate-enable logic based on the determined number of clock cycles during which the output of the second gate-enable logic causes the clock signal to be gated.

\* \* \* \* \*